US009361956B2

(12) United States Patent
Jeon et al.

(10) Patent No.: US 9,361,956 B2
(45) Date of Patent: Jun. 7, 2016

(54) PERFORMING LOGICAL OPERATIONS IN A MEMORY

(71) Applicant: Advanced Micro Devices, Inc., Sunnyvale, CA (US)

(72) Inventors: Hye Ran Jeon, Los Angeles, CA (US); Gabriel H. Loh, Bellevue, WA (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 198 days.

(21) Appl. No.: 14/156,071

(22) Filed: Jan. 15, 2014

(65) Prior Publication Data

US 2015/0199150 A1    Jul. 16, 2015

(51) Int. Cl.
*G11C 7/10* (2006.01)
*G06F 3/06* (2006.01)

(52) U.S. Cl.
CPC ............ *G11C 7/1006* (2013.01); *G11C 7/1078* (2013.01); *G06F 3/061* (2013.01); *G06F 3/0659* (2013.01); *G06F 3/0688* (2013.01)

(58) Field of Classification Search
CPC .......................... G11C 7/1006; G11C 7/1078
See application file for complete search history.

(56) References Cited

U.S. PATENT DOCUMENTS

| 5,289,418 | A  | * | 2/1994  | Youngerth | .......... | G06F 11/1076 365/201 |
| 6,320,791 | B1 | * | 11/2001 | Mio       | .......... | G11C 16/10 365/185.04 |
| 8,159,864 | B2 | * | 4/2012  | Yoon      | .......... | G11C 11/16 365/158 |
| 8,429,496 | B2 | * | 4/2013  | Yamada    | .......... | G06F 11/1008 714/764 |

OTHER PUBLICATIONS

Fang, Z. et al., Active Memory Operations, ICS '07, Jun. 2007.

* cited by examiner

*Primary Examiner* — Vanthu Nguyen
(74) *Attorney, Agent, or Firm* — Park, Vaughan, Fleming & Dowler LLP

(57) ABSTRACT

The described embodiments include a memory with a memory array and logic circuits. In these embodiments, logical operations are performed on data from the memory array by reading the data from the memory array, performing a logical operation on the data in the logic circuits, and writing the data back to the memory array. In these embodiments, the logic circuit is located in the memory so that the data read from the memory array need not be sent to another circuit (e.g., a processor coupled to the memory, etc.) to have the logical operation performed.

17 Claims, 5 Drawing Sheets

US 9,361,956 B2

PERFORMING LOGICAL OPERATIONS IN A MEMORY

GOVERNMENT LICENSE RIGHTS

The described embodiments relate to computing devices. More specifically, the described embodiments relate to circuits for performing logical operations in memories in computing devices.

BACKGROUND

1. Field

The described embodiments relate to computing devices. More specifically, the described embodiments relate to circuits for performing logical operations in a memories in computing devices.

2. Related Art

Virtually all modern computing devices include some form of memory that is used to store data and instructions that are used by entities in the computing device for performing computational operations. For example, one common configuration of computing devices includes a central processing unit (CPU) and a main memory, with the main memory storing instructions and data used by the CPU for performing computational operations. Another common configuration of computing devices includes a graphics processing unit (GPU) and graphics memory, with the graphics memory storing instructions and data used by the GPU for performing computational operations. Generally, when performing computational operations, an entity retrieves data from the memory and uses the data to perform computational operations. If there are any results from the computational operations, the entity then writes the results back to the memory. Because the transfer of the data between entities in the computing device and the memory typically occurs at a significantly slower rate than the rate at which the entities are able to use the data when performing computational operations, retrieving data and writing back results slows the rate at which entities are able to perform computational operations. In addition, communication of the data between the memory and the entities uses bandwidth on signal paths between the memory and the entities, requires computational processing to handle the communication, and increases the overall power consumption of the computing device.

BRIEF DESCRIPTION OF THE FIGURES

Throughout the figures and the description, like reference numerals refer to the same figure elements.

DETAILED DESCRIPTION

Figure 1:
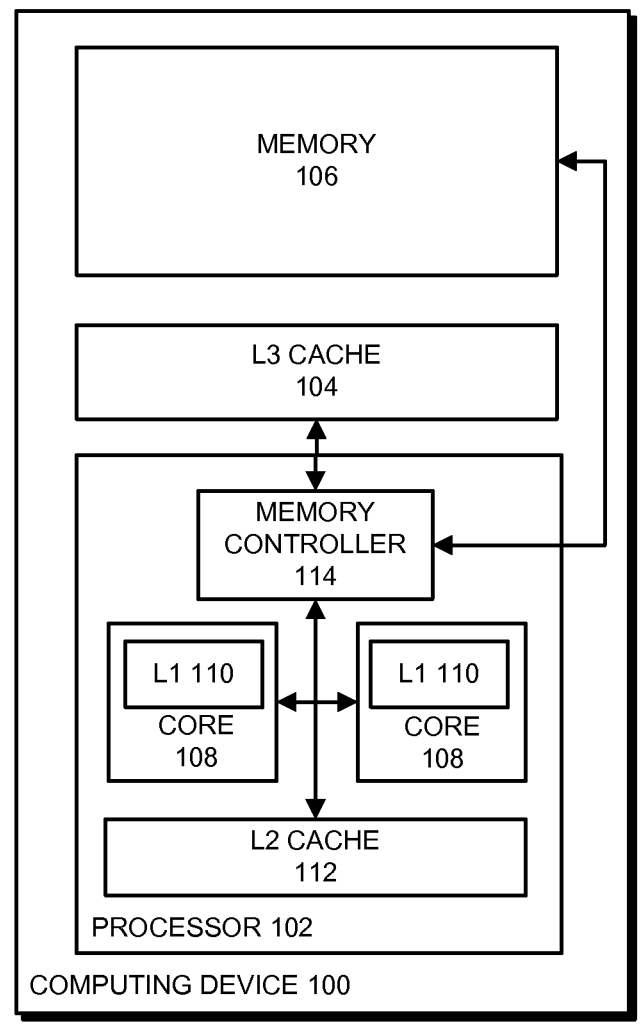
FIG. 1 presents a block diagram illustrating a computing device in accordance with some embodiments.

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Overview

The described embodiments include a memory with a memory array (i.e., an array of memory elements/cells that store data) and a logic circuit. In these embodiments, logical operations are performed on data from the memory array by reading the data from the memory array, performing a logical operation on the data in the logic circuit, and writing the result of the logical operation back to the memory array. In these embodiments, the logic circuit is located in the memory and thus the data read from the memory array need not be sent to another functional block (e.g., a processor coupled to the memory, etc.) to have the logical operation performed. For example, the logic circuit may be located on the same semiconductor chip as the memory array. As another example, the logic circuit may be located on a different semiconductor chip than the memory array, but with a high-speed and/or dedicated communication interface between the semiconductor chips to enable high-speed transfer of the data between the integrated circuit chips.

The logic operations performed by the logic circuit can include various types of logic operations. For example, in some embodiments, the logic operations include simple logic operations such as AND, NOR, XOR, INV, etc. As another example, in some embodiments, the logic operations include more-complex logic operations such as compound logical operations (e.g., AND-OR-INV, etc.) or purpose-specific/custom logical operations.

In some embodiments, a functional block external to the memory (e.g., a processor coupled to the memory, etc.) sends a command to a controller in the memory indicating that a corresponding logical operation is to be performed by the logic circuit on specified data. Based on the received command, the controller causes the logical operation to be performed by the logic circuit. In some of these embodiments, the logic circuit includes logic circuits for performing two or more logic operations and/or configurable logic circuits and the controller selectively configures the logic circuit to perform logic operations based on received commands.

By performing the logic operations in the logic circuit that is located in the memory, the logic operations are performed faster and more efficiently (in terms of power consumption, memory system bandwidth, computational operations, etc.) than if the data were to be transmitted from the memory to another functional block, the logical operation performed in the other functional block, and the result returned to the memory. This can, in turn, enable faster and more efficient operation of a computing device in which the memory is located.

Computing Device

FIG. 1 presents a block diagram illustrating a computing device 100 in accordance with some embodiments. As can be seen in FIG. 1, computing device 100 includes processor 102, L3 cache 104, and memory 106. Processor 102 is generally a device that performs computational operations in computing device 100. Processor 102 includes two processor cores 108, each of which includes a computational mechanism such as a central processing unit (CPU), a graphics processing unit (GPU), and/or an embedded processor. Processor 102 also includes cache memories (or "caches") that are used for storing instructions and data that are used by the processor cores 108 for performing computational operations. As can be seen in FIG. 1, the caches in processor 102 include a level-one (L1) cache 110 ("L1 110") in each processor core 108 that is used for storing instructions and data for use by the processor core 108. Generally, the L1 caches 110 are the smallest of a set of caches in computing device 100 and are located closest to the circuits (e.g., execution units, instruction fetch units, etc.) in the processor cores 108 that use the instructions and data. Processor 102 also includes a level-two (L2) cache 112 that is shared by two processor cores 108 and hence is used for storing instructions and data for both of the sharing processor cores 108. Generally, L2 cache 112 is larger than the L1 caches 110 and is, in some embodiments, located outside, but close to, processor cores 108 on the same semiconductor die as the processor cores 108.

Returning to computing device 100, level-three (L3) cache 104, which is the largest of the caches in computing device 100, is shared by the processor cores 108 in processor 102 and hence is used for storing instructions and data for both of the processor cores 108. In some embodiments, L3 cache 104 is located external to processor 102 (e.g., on a different die or dies than processor 102).

In some embodiments, L1 cache 110, L2 cache 112, and L3 cache 104 are fabricated from memory circuits such as one or more of static random access memory (SRAM), embedded dynamic random access memory (eDRAM), dynamic random access memory (DRAM), double data rate synchronous DRAM (DDR SDRAM), and/or other types of memory circuits.

Memory 106 comprises memory circuits that form a "main memory" of computing device 100. Memory 106 is used for storing instructions and data for use by the processor cores 108 on processor 102. In some embodiments, memory 106 is fabricated from memory circuits such as one or more of DRAM, DDR SDRAM, and/or other types of memory circuits.

Taken together, L1 cache 110, L2 cache 112, L3 cache 104, and memory 106 form a "memory hierarchy" in and for computing device 100. Each of the caches and memory 106 are regarded as levels of the memory hierarchy, with the lower levels including the larger caches and memory 106.

Memory controller 114 is a functional block that controls access to L3 cache 104 and memory 106 for memory requests generated in processor 102. Generally, in these embodiments, when data (computational data, instructions, etc.) is to be accessed by a processor core 108 (or another functional block in processor 102), the processor core 108 (or the other functional block) sends a request to memory controller 114 requesting access to the data. Memory controller 114 then sends the memory request to L3 cache 104 or memory 106 for satisfaction/resolution of the memory request. In these embodiments, satisfaction/resolution of a memory request includes operations such as retrieving the requested data from L3 cache 104 or memory 106, writing data to L3 cache 104 or memory 106, etc.

In the described embodiments, memory 106 includes a logic circuit (not shown) that is used for performing logical operations (e.g., NAND, XOR, OR, INV, complex logical operations, and/or other logical operations or combinations thereof) on data from memory circuits in memory 106 (e.g., from a memory array that stores data in memory 106). More specifically, based on a command and possibly logic input data from processor 102/memory controller 114, and/or another functional block in computing device 100, data is retrieved from the memory circuits, logical operations indicated by the command are performed on the data (possibly using logic input data to perform the logical operation), and the results are written back to the memory circuits. In this way, logic operations may be performed in memory 106, instead of sending the data from memory 106 to processor 102 to have the logical operation performed, and then returning the results from processor 102 to memory 106.

In some embodiments, communication paths (that include one or more busses, wires, and/or connections) are coupled between the various elements in computing device 100 (core 108, memory controller 114, memory 106, etc.), as shown by arrow-headed lines between the elements. The communication paths are used to transmit commands such as memory requests, data such as return data for memory requests, and/or other information between the elements.

Although embodiments are described with a particular arrangement of processor cores, some embodiments include a different number and/or arrangement of processor cores. For example, some embodiments have only one processor core (in which case the caches are used by the single processor core), while other embodiments have two, six, eight, or another number of processor cores—with the cache hierarchy adjusted accordingly. Generally, the described embodiments can use any arrangement of processor cores that can perform the operations herein described.

Additionally, although embodiments are described with a particular arrangement of caches, some embodiments include a different number and/or arrangement of caches. For example, the caches (e.g., L1 cache 110, etc.) may be divided into separate instruction and data caches. Additionally, L2 cache 112 may not be shared, and hence may only be used by a single processor core (and hence there may be two L2 caches 112 in processor 102). As another example, some embodiments include different levels of caches, from only one level of cache to multiple levels of caches, and these caches may be located in processor 102 and/or external to processor 102. Generally, the described embodiments can use any arrangement of caches that can perform the operations herein described.

Moreover, although computing device 100 and processor 102 are simplified for illustrative purposes, in some embodiments, computing device 100 and/or processor 102 include additional mechanisms for performing the operations herein described and other operations. For example, computing device 100 and/or processor 102 may include power controllers, mass-storage devices such as disk drives or large semiconductor memories (as part of the memory hierarchy), batteries, media processors, input-output mechanisms, communication mechanisms, networking mechanisms, display mechanisms, etc.

Computing device 100 can be or can be included in any electronic device that performs computational operations. For example, computing device 100 can be or can be included in electronic devices such as desktop computers, laptop computers, tablet computers, smart phones, servers, network appliances, toys, audio-visual equipment, home appliances, controllers, etc., and/or combinations thereof.

Memory with Logic Circuit

Figure 2:
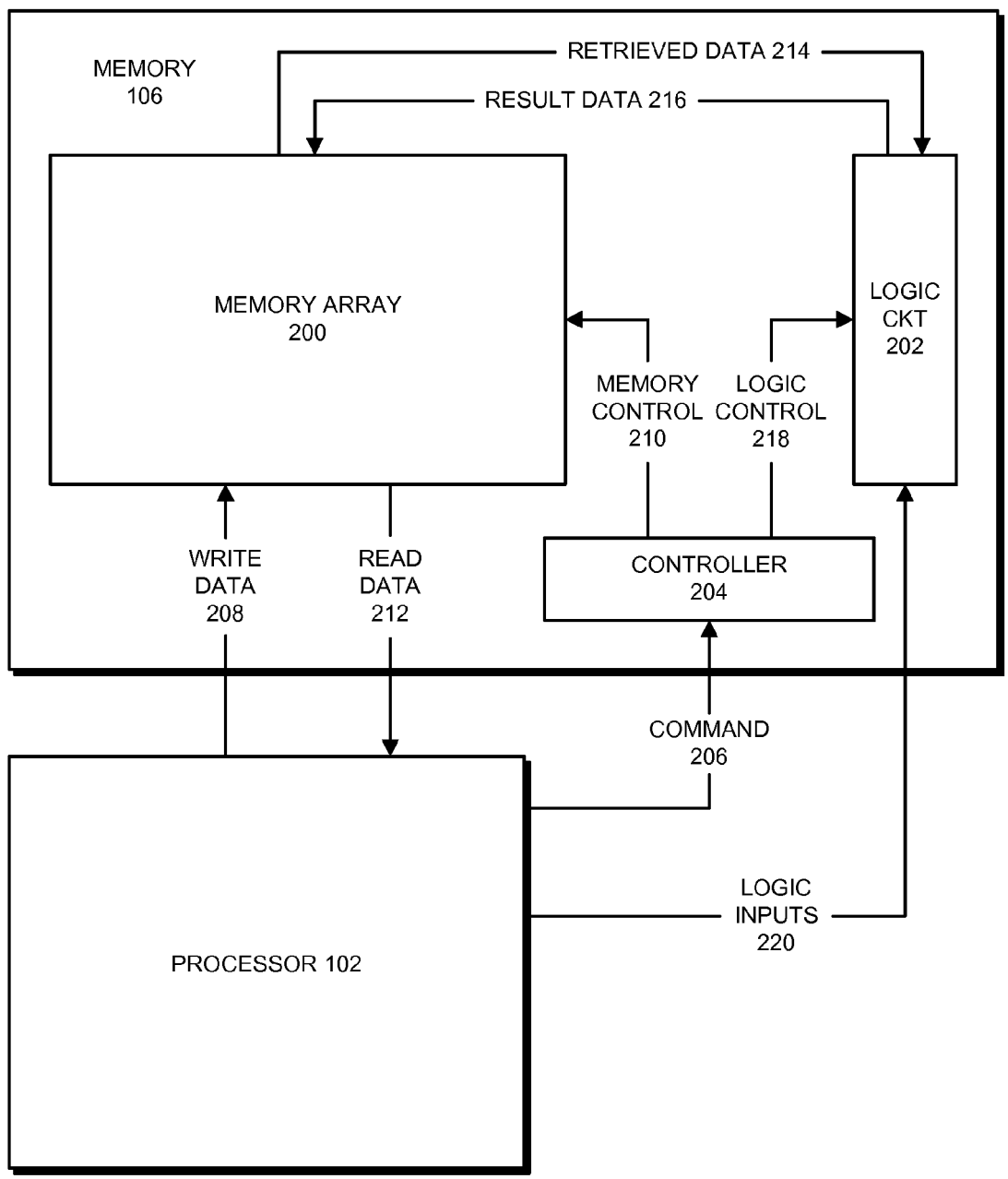
FIG. 2 presents a block diagram illustrating a processor and a memory in accordance with some embodiments.

FIG. 2 presents a block diagram illustrating processor 102 and memory 106 in accordance with some embodiments. As shown in FIG. 2, memory 106 includes memory array 200, logic circuit 202, and controller 204. Memory array 200 includes memory circuits (DRAM, DDR SDRAM, and/or other types of memory circuits) that are configured to store instructions and data in memory 106. In addition to the memory circuits, in some embodiments, memory array 200 includes circuits for accessing the memory circuits, managing operation of the memory circuits, and/or performing operations using data retrieved from or destined for the memory circuits such as row buffers, write drivers, refresh circuits, error checking circuits, etc. (not shown in FIG. 2).

During operation, processor 102 (and/or other functional blocks in computing device 100) may write data to memory array 200 and/or read data from memory array 200 (the general term "data" includes instructions and/or data for operations). When writing data to memory array 200, processor 102 (e.g., memory controller 114 and/or another functional block in processor 102) sends, to controller 204, a command 206 that indicates that write data 208 (which is also provided by processor 102 in the illustrated embodiment) is to be stored in memory array 200 in a given location (e.g., memory address). Based on the command 206, controller 204, via memory control 210, configures memory array 200 to store write data 208 in the given location. When reading data from memory array 200, processor 102 (e.g., memory controller 114 and/or another functional block in processor 102) sends, to controller 204, a command 206 that indicates that data is to be read from memory array 200 from a given location (e.g., memory address). Based on the command 206, controller 204, via memory control 210, configures memory array 200 to output the data as read data 212 to processor 102.

Logic circuit 202 (shown as "logic ckt 202" in FIG. 2) includes a set of logic circuits for performing logical operations on retrieved data 214 from memory array 200. Generally, in the described embodiments, logic circuit 202 may include any logic circuits or combinations of logic circuits that are configured to perform logical operations on retrieved data 214. For example, in some embodiments, logic circuit 202 includes logic circuits such as NAND circuits, NOR circuits, AND circuits, XOR circuits, INV (inverter) circuits, complex logic circuits that implement a designated combination of logical operations, etc. After the logical operations are performed on retrieved data 214, the results are written back to memory array 200 as result data 216.

In some embodiments, logic circuit 202 is configurable via logic control 218 to perform various operations. For example, in some embodiments, one or more of the logic circuits in the set of logic circuits in logic circuit 202 may include two or more portions, each portion performing an associated operation, each of which can be enabled or disabled using logic control 218. As another example, in some embodiments, logic control 218 is coupled to steering logic in logic circuit 202 that controls the logic circuits within logic circuits 202 to which retrieved data 214 is routed for the performance of the logical operation(s) within logic circuit 202. In some embodiments, logic control 218 controls when logic operations are performed in logic circuit 202 (e.g., initiates logic operations).

In some embodiments, logic inputs 220 are used for performing logical operations in logic circuit 202. In these embodiments, logic inputs 220 include one or more bits, signals, and/or other inputs that are used as inputs, adjustments, references, etc. for the logical operations. For example, in some embodiments, logic inputs 220 are used for the logical value (i.e., input signal) for at least one input of one or more multi-input logic circuits in the set of logic circuits. In addition to and/or instead of logic inputs 220, some embodiments use internal signals (VDD, VSS, bias signals, reference signals, etc.) that are selectively or continuously coupled (e.g., as input signals) to logic circuits in logic circuit 202. For example, in some embodiments, at least one input of a multi-input logic circuit is continuously or selectively coupled to VSS or VDD. In some embodiments, the coupling of logic inputs 220 and/or the internal signals to logic circuits in logic circuit 202 is controlled by logic control 218 (and thus by command 206) to effect operations in logic circuit 202. In some embodiments, logic inputs 220 can be continuously or selectively set, asserted, updated/changed, etc. by processor 102.

Note that, as shown in FIG. 2, in some embodiments, logic circuit 202 is incorporated in memory 106. For example, in some embodiments, memory 106 and logic circuit 202 are included on the same semiconductor die. As another example, in some embodiments, memory 106 and logic circuit 202 are on separate semiconductor dies, but are configured (via optimized signal routes, etc.) to enable high-speed communication between the semiconductor dies. For instance, in some embodiments, memory 106 and logic circuit 202 are incorporated in separate semiconductor dies that are arranged in a stack. In these embodiments, the stacked semiconductor dies may be configured with through-silicon vias, proximity communication mechanisms, soldered connections, and/or other signal routes that enable high-speed communication between the semiconductor dies. By having logic circuit 202 incorporated in memory 106, these embodiments enable the logical operations to be performed at high speed—particularly relative to the speed at which results for the logical operation could be obtained if the data from memory array 200 was to be sent to processor 102 to have the logical operation performed instead of performing the logical operation in logic circuit 202. In addition, these embodiments avoid the need for sending the data to processor 102 for performing the logical operation, which may save communication bandwidth, processing operations (in both processor 102 and memory 106), electrical power, etc.

Although various functional blocks and signals are described for FIG. 2, in some embodiments, different functional blocks and/or signals are used in performing operations. For example, although shown separately in FIG. 2, in some embodiments, write data 208 and logic inputs 220 use the same signal connections (wires, transmitters/receivers, etc.). Generally, computing device 100 can include any functional blocks and/or signals that can perform the operations herein described.

Memory Array and Logic Circuit

Figure 3:
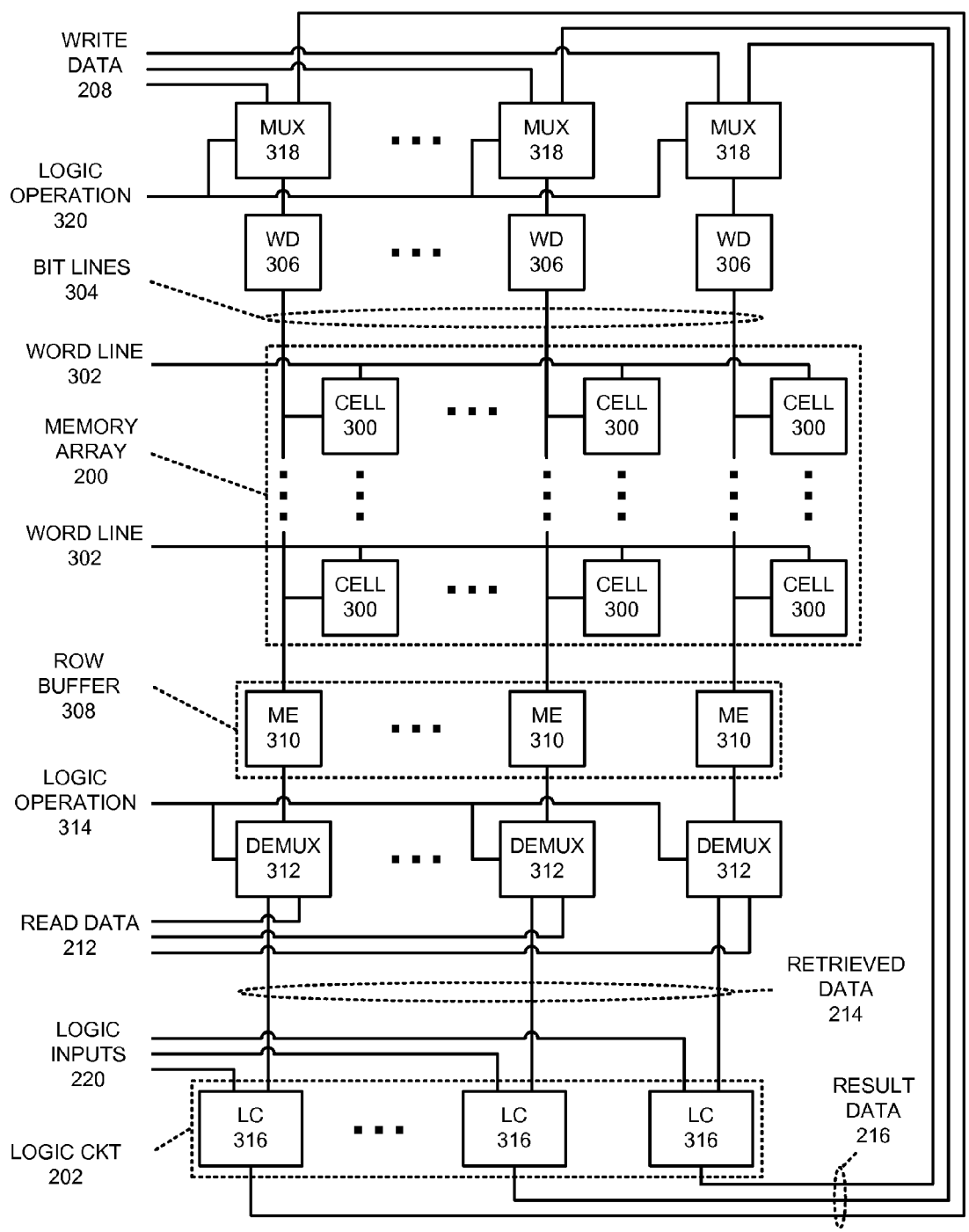
FIG. 3 presents a block diagram illustrating a memory array coupled to a logic circuit in accordance with some embodiments.

FIG. 3 presents a block diagram illustrating memory array 200 coupled to logic circuit 202 in accordance with some embodiments. More specifically, FIG. 3 includes elements and signals for controlling whether a read/write operation or a logical operation is performed using data retrieved from or destined for memory array 200.

As shown in FIG. 3, memory array 200 includes a set of cells 300, each of which stores a bit of data (e.g., in transistors, capacitors, and/or other elements within the cells, depending on the type of memory circuits in which memory array 200 implemented) within the memory array 200. The cells 300 are arranged in rows and columns, with each cell 300 in a row being coupled to a corresponding word line 302 and with each cell in a column being coupled to a corresponding bit line 304. The word line 302 for a given row is activated when data is to be read from or written to the cells 300 in the row. More specifically, when data is to be written to cells 300 in a given row, the write drivers 306 (shown as "WD 306") are activated/enabled to drive values on corresponding bit lines 304 and the corresponding word line 302 is activated to cause the values on the bit lines 304 to be stored in cells 300 in the given row. When data is to be read from cells 300 in a given row, the write drivers 306 are deactivated/disabled (to avoid contending with the cells 300 on the bit lines 304) and the corresponding word line 302 is activated to cause the value in the cells 300 in the given row to be placed on the corresponding bit lines 304. In some embodiments, the word lines 302 (or signals for controlling the word lines) are included in memory control 210 and thus are controlled by controller 204. In these embodiments, controller 204 manages read and write operations for cells 300 in memory array 200.

Row buffer 308 includes memory elements 310 (shown as "ME 310") which are (or include) memory circuits that are configured to capture and store data from bit lines 304. For example, in some embodiments, memory elements 310 are (or include) sense-amp latch circuits (i.e., differential latching circuits), dynamic latches, jam latches, and/or other memory elements. As can be seen in FIG. 3, row buffer 308 includes sufficient memory elements to capture and store data from a row of cells 300 in memory array 200 at a time, which enables a row of data to be read out of memory array 200 and stored. The data stored in row buffer 308 can then be used for performing various operations (including the logical operation described herein).

The output of each memory element 310 in row buffer 308 is coupled to the input of a demultiplexer 312 (shown as "DEMUX 312"). Demultiplexer 312 is a demultiplexer circuit that is configured to, based on the logical state of the logic operation 314 control signal, forward the data (i.e., the value) from the output of the corresponding memory element 310 to either: (1) read data 212 (for a read operation in which data is sent to processor 102) or (2) retrieved data 214 (when a logical operation is to be performed on the data). In this way, the logic operation 314 control signal is used to control whether or not a logical operation is performed on the data. In some embodiments, the logic operation 314 control signal is included in memory control 210 and thus is controlled by controller 204. In these embodiments, controller 204 manages whether data output from memory elements 310 is sent to read data 212 or is forwarded to logic circuits 316.

When logic operation 314 control signal forwards the value from the output of the memory elements 310 to retrieved data 214, the data is received on a first input of a corresponding logic circuit 316 (shown as "LC 316" in FIG. 3). In some embodiments, a second input of each logic circuit 316 is coupled to logic inputs 220. Each logic circuit 316 includes circuits that are configured to perform logical operations using the input data. For example, the circuits in each logic circuit 316 may include simple logic circuits (e.g., NAND, XOR, INV, etc.), complex logic circuits, control circuits, dynamic circuits, timing circuits, memory elements (latches, etc.), programmable gate arrays, and/or other circuits. Generally, the circuits in logic circuits 316 can include any type of circuit that can be used to perform a logical operation (which may include one or more sub-operations).

Although an embodiment is described where logic circuits 316 include two inputs and perform a single logical operation, in some embodiments, logic circuits 316 are configured differently. For example, in some embodiments, logic circuits 316 include only one input, which is coupled to the output of a corresponding demultiplexer 312. In these embodiments, the logical operation performed in logic circuit 316 may use only retrieved data 214 (e.g., may be a simple inversion) and/or the logical operation may use values other than logic inputs 220 such as VSS, VDD, bias voltages, reference voltages, prior values of retrieved data 214, etc. as inputs. As another example, in some embodiments, the logic circuits 316 include one or more circuits for performing additional logical operations and/or other operations, such as rearrangement or replacement operations (shifts, rotations, masking, etc.), comparisons, conditional operations, etc.

As described above, although not shown in FIG. 3, in some embodiments, logic control 218 controls the logical operation performed by each logic circuit 316. For example, in some embodiments, logic circuit 316 includes circuits configured to selectively perform one or more logical operations and logic control 218 may be used for selecting the logical operation to be performed (e.g., by steering data within logic circuit 316, by disabling/enabling portions of the circuits in logic circuit 316, etc.).

After the logical operation is performed in each logic circuit 316, the result from the logical operation is forwarded, via result data 216, to a first input of a corresponding multiplexer 318. A second input of each multiplexer 318 is coupled to a corresponding write data 208 input. Each multiplexer 318 is a multiplexer circuit that is configured to, based on the logical state of the logic operation 320 control signal, forward the data (i.e., the value) from either: (1) write data 208 (for a write operation) or (2) result data 216 (when a logical operation has been performed) to an input of a corresponding write driver 306. In this way, the logic operation 320 control signal is used to control whether or not a logical operation is performed on the data. In some embodiments, the logic operation 320 control signal is included in memory control 210 and thus is controlled by controller 204. In these embodiments, controller 204 manages whether results output from logic circuits 316 or write data 208 is sent to write drivers 306. In some embodiments, the logic operation 320 signal and the logic operation 314 signal are the same signal.

The data received from multiplexer 318 on the input of each write driver 306 is then written to cells 300 in a given row as described above. More specifically, the write drivers 306 are activated/enabled to drive the values from multiplexers 318 onto corresponding bit lines 304 and the corresponding word line 302 is activated to cause the values on the bit lines 304 to be stored in cells 300 in the given row.

Although a number of elements are shown in FIG. 3, e.g., six cells 300, three memory elements 310, etc., some embodiments include a different number of elements (as shown by the ellipses in FIG. 3). For example, in some embodiments, memory array 200 includes a significantly larger number of rows and cells 300 in each row, e.g., 2048, 8192, or another number, with a correspondingly larger number of the elements coupled to the memory array. For instance, 2048 memory elements 310, logic circuits 316, etc. when a row includes 2048 cells 300, etc. Generally, the described embodiments may include any number of elements that can perform the operations herein described.

In addition, although various functional blocks (elements, circuits, etc.) are shown in FIG. 3, in some embodiments, different functional blocks may be present. For example, in some embodiments, the demultiplexers 312 are not included between memory elements 310 and logic circuits 316. In these embodiments, the outputs of the memory elements 310 may be coupled directly to both the corresponding read data 212 and the first input of the corresponding logic circuit 316 (and processor 102 handles read data 212 accordingly). Generally, the described embodiments include sufficient functional blocks to retrieve data from a memory array 200, perform a logical operation on the data, and store the result of the logical operation back to the memory array 200 within the memory 106 (i.e., without sending the data to a processing circuit such as processor 102).

Performing a Logical Operation using a Logic Circuit in a Memory

Figure 4:
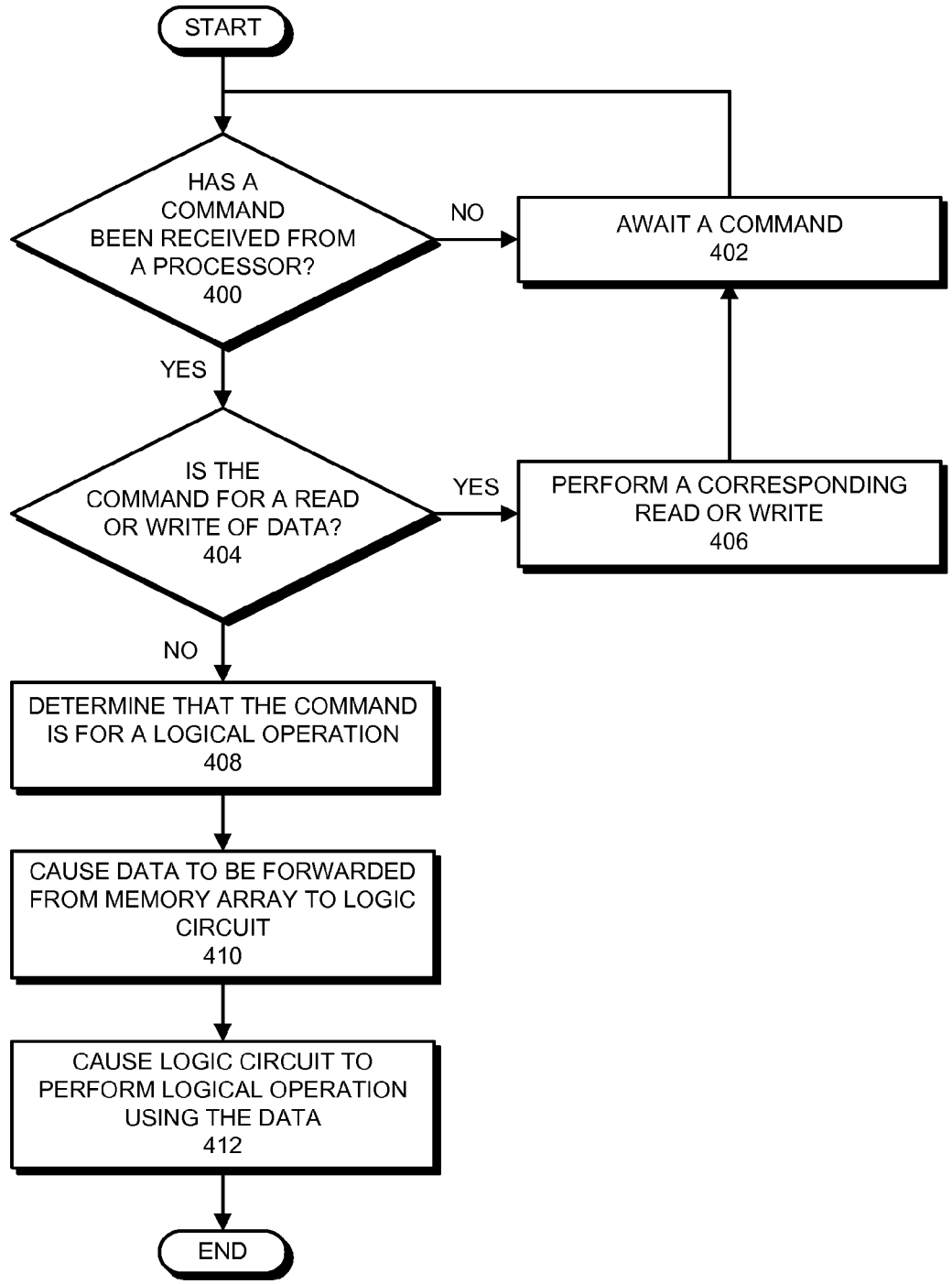
FIG. 4 presents a block diagram illustrating a process for performing a logical operation using a logic circuit in a memory in accordance with some embodiments.

FIG. 4 presents a block diagram illustrating a process for performing a logical operation using a logic circuit 202 in memory 106 in accordance with some embodiments. More specifically, FIG. 4 presents operations performed by a controller 204 for performing a logical operation on data from memory array 200 using a logic circuit 202.

Note that the operations shown in FIG. 4 are presented as a general example of operations performed by some embodiments. The operations performed by other embodiments include different operations and/or operations that are performed in a different order. Additionally, although certain mechanisms are used in describing the operations (e.g., controller 204, logic circuit 202, etc.), in some embodiments, other mechanisms may perform the operations.

The process shown in FIG. 4 starts when controller 204 in memory 106 determines whether a command has been received from processor 102 via command 206 (step 400). If not, controller 204 awaits a command (step 402). Otherwise, if a command has been received (step 400), controller 204 determines if the command is a request for data to be read from or written to memory array 200 (step 404). For example, controller 204 can analyze or decode the command and compare the command with a list of commands, etc. to determine if the command is a read or write command. If so, controller 204 uses memory control 210 to cause memory array 200 to perform a corresponding read (which returns read data 212 to processor 102) or write (which stores write data 208 in a corresponding location in memory array 200) (step 406). Controller 204 then returns to step 402 to await a next command from processor 102.

Note that, as described, controller 204 receives the command from processor 102. Processor 102 may generate the command while executing program code, upon encountering an event, and/or while otherwise performing operations.

If the command is not a request for data to be read from or written to memory array 200 (step 404), controller 204 determines that the command is for a logical operation to be performed on data from memory array 200 (step 408). (Note that this example, for clarity and brevity, assumes that there are only read, write, and logical operation commands, however, in some embodiments, there are other commands, such as control commands, configuration commands, memory array 200 management commands, other types of read/write/logical operation commands, etc.)

Generally, the above-described command to perform the logical operation indicates that the logical operation is to be performed (i.e., is a request to perform the logical operation). The command may also include other information, such as a location of the data upon which the logical operation is to be performed (e.g., an address in memory array 200), an amount of data upon which the logical operation is to be performed (e.g., some or all of one or more rows in memory array 200), etc. In some embodiments, any applicable format of command may be used, including a general inter-functional-block message, a dedicated packet received on a communication bus, a predetermined value on a signal line (e.g., a logical one, a multi-bit value, etc.) and/or another format of command.

Controller 204 then uses memory control 210 to cause memory array 200 to retrieve the data (upon which the logical operation is to be performed) and forward the data to logic circuit 202 as retrieved data 214 (step 410). For example, controller 204 can indicate that a row of data is to be read from memory array 200 into row buffer 308 and that some or all of the data in the row buffer 308 is to be forwarded to logic circuit 202 as retrieved data 214.

Next, controller 204 uses logic control 218 to cause logic circuit 202 to perform the logical operation on the retrieved data 214 (step 412). In these embodiments, controller 204 may assert a particular value on logic control 218 to cause the logical operation to be performed (e.g., a logical one or zero, a multi-bit value, a message of a given format, etc.). The logical operation performed by logic circuit 202 may include any of the logical operations herein described.

Although controller 204 is described as causing, via logic control 218, logic circuit 202 to perform a logical operation, in some embodiments, logic circuit 202 includes circuits (asynchronous logic circuits, etc.) that perform the logic operation without receiving a command (i.e., automatically), and thus logic control 218 is not used as described. However, logic control 218 may be used to configure the logic circuits in logic circuit 202 and/or for performing other operations. For example, controller 204 may configure logic circuit 202 to perform one or more logical operations from among a set of logical operations that are supported by (i.e., may be performed by) logic circuit 202. For instance, logic circuit 202 may include logic circuits for (and therefore support) performing one of a NAND, an XOR, or an INV at a time and controller 204 may configure logic circuits 202 to perform one of the logical operations.

Although logic circuit 202 is described as performing a single logical operation, in some embodiments, logic circuit 202 may perform two or more logical operations. In addition, in some embodiments, logic circuit 202 may perform other operations (instead of or in addition to the logical operation(s)) such as rearrangement or replacement operations (shifts, rotations, masking, etc.), arithmetic operations, comparisons, conditional operations, etc.

Figure 5:
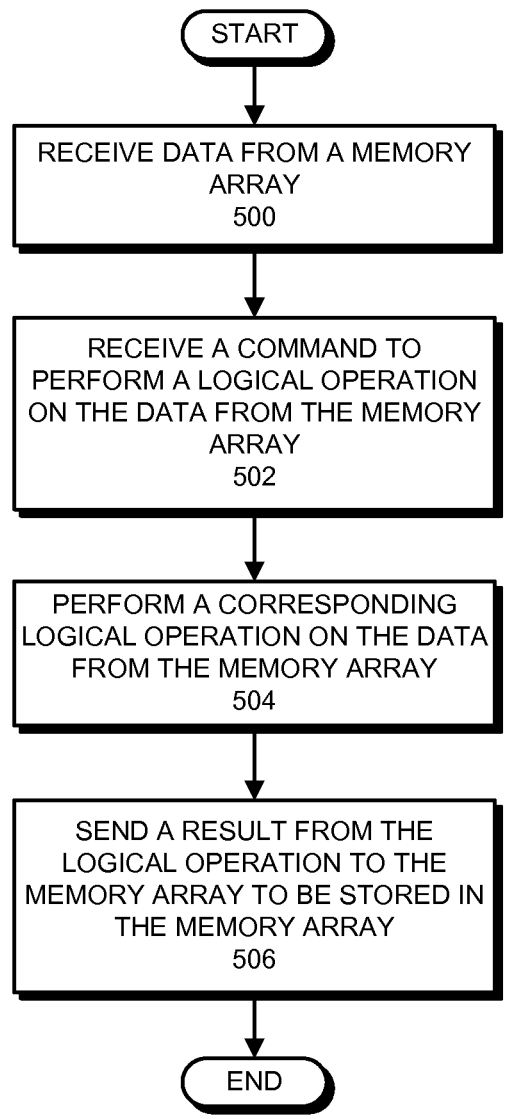
FIG. 5 presents a block diagram illustrating a process for performing a logical operation using a logic circuit in a memory in accordance with some embodiments.

FIG. 5 presents a block diagram illustrating a process for performing a logical operation using a logic circuit in a memory in accordance with some embodiments. More specifically, FIG. 5 presents operations performed by logic circuit 202 when performing a logical operation on data from memory array 200.

Note that the operations shown in FIG. 5 are presented as a general example of operations performed by some embodiments. The operations performed by other embodiments include different operations and/or operations that are performed in a different order. Additionally, although certain mechanisms are used in describing the operations (e.g., controller 204, logic circuit 202, etc.), in some embodiments, other mechanisms may perform the operations.

The process shown in FIG. 5 starts when logic circuit 202 receives data from memory array 200 as retrieved data 214 (step 500). For example, logic circuit 202 may receive some or all of the data from a row of memory array 200. Logic circuit 202 also receives, from controller 204, a command to perform a logical operation on the data from the memory array 200 (step 502). The information and format of the command in some embodiments is described above.

Logic circuit 202 then performs a corresponding logical operation on the data from memory array 200 (step 504). For example, in some embodiments, the logic operation includes using a corresponding two-input XOR circuit in logic circuit 202 to perform a logical XOR operation using each bit of the retrieved data 214 and an associated bit/value from logic input 220. As another example, in some embodiments, the logic operation includes using a corresponding complex logic circuit to perform a complex logical operation using each bit of the retrieved data 214, an associated bit/value from logic input 220, and/or an internal input (e.g., VSS, a reference value, etc.) in logic circuit 202.

Logic circuits 202 then send the result from the logical operation to memory array 200 to be stored in memory array 200 (step 506). In this way, these embodiments retrieve data from memory array 200, perform the logical operation, and write the result back to memory array 200.

Although controller 204 is described as causing, via logic control 218, logic circuit 202 to perform a logical operation, in some embodiments, logic circuit 202 includes circuits (asynchronous logic circuits, etc.) that perform the logic operation without receiving a command (i.e., automatically), and thus logic control 218 is not used as described. However, logic control 218 may be used to configure the logic circuits in logic circuit 202 and/or for performing other operations. For example, controller 204 may configure logic circuit 202 to perform one or more logical operations from among a set of logical operations that are supported by (i.e., may be performed by) logic circuit 202. For instance, logic circuit 202 may include logic circuits for (and therefore support) performing one of a NAND, an XOR, or an INV at a time and controller 204 may configure logic circuits 202 to perform one of the logical operations.

Although logic circuit 202 is described as performing a single logical operation, in some embodiments, logic circuit 202 may perform two or more logical operations. In addition, in some embodiments, logic circuit 202 may perform other operations (instead of or in addition to the logical operation(s)) such as rearrangement or replacement operations (shifts, rotations, masking, etc.), arithmetic operations, comparisons, conditional operations, etc.

Logical Operations and Other Operations

As described herein, logic circuit 202 in memory 106 includes circuits (logic elements, etc.) for performing logical operations. In some embodiments, the logical operations may include simple logical operations such as AND, OR, NAND, NOR, INV, XOR, and/or other basic logic operations. In some embodiments, the logical operations include complex logical operations. For example, the complex logical operations may include compound logical operations such as AND-OR-NV for which multiple simple logical operations are implemented in a combined circuit. As another example, the complex logical operations may include complex circuits (e.g., integrated circuit logic gates) that are custom-designed to implement particular logical functions.

Although "logical" operations are described herein, in some embodiments, other operations are performed instead of or in addition to the logical operations. For example, in some embodiments, logic circuit 202 includes circuits for performing shifts, rotations, masking, and/or other rearrangement or replacement operations alone or in combination with logical operations (and other operations). As another example, in some embodiments, logic circuit 202 includes circuits for performing comparisons, arithmetic operations, conditional operations, etc. alone or in combination with logical operations (and other operations). Generally, in some embodiments, logic circuit 202 can include any type of operation that can be performed on or using retrieved data 214 to generate result data 216.

In addition, in some embodiments, logic circuit 202 includes mechanisms (e.g., control elements, enable/disable signals, masks, and/or other mechanisms) that can be used to configure logic circuit 202 to perform operations on only a portion of a row of data from row buffer 308. For example, in some embodiments, each logic circuit 316 is coupled to a disable signal. In these embodiments, controller 204 can assert (e.g., set to a logical 1) one or more of the disable signals to cause the corresponding logic circuit 316 to pass retrieved data 214 unchanged through the logic circuit 316—so that retrieved data 214 is written back to memory array 200 (as result data 216) in the state in which it was retrieved from memory array 200. In these embodiments, controller 204 may use the mechanisms to configure logic circuit 202 to perform an operation on any portion of a row of data (e.g., half the row, one or more bits, etc.).

In some embodiments, a computing device (e.g., computing device 100 in FIG. 1 and/or some portion thereof) uses code and/or data stored on a computer-readable storage medium to perform some or all of the operations herein described. More specifically, the computing device reads the code and/or data from the computer-readable storage medium and executes the code and/or uses the data when performing the described operations.

A computer-readable storage medium can be any device or medium or combination thereof that stores code and/or data for use by a computing device. For example, the computer-readable storage medium can include, but is not limited to, volatile memory or non-volatile memory, including flash memory, random access memory (eDRAM, RAM, SRAM, DRAM, DDR, DDR2/DDR3/DDR4 SDRAM, etc.), read-only memory (ROM), and/or magnetic or optical storage mediums (e.g., disk drives, magnetic tape, CDs, DVDs). In the described embodiments, the computer-readable storage medium does not include non-statutory computer-readable storage mediums such as transitory signals.

In some embodiments, one or more hardware modules are configured to perform the operations herein described. For example, the hardware modules can comprise, but are not limited to, one or more processors/cores/central processing units (CPUs), application-specific integrated circuit (ASIC) chips, field-programmable gate arrays (FPGAs), caches/cache controllers, compute units, embedded processors, graphics processors (GPUs)/graphics cores, pipelines, Accelerated Processing Units (APUs), and/or other programmable-logic devices. When such hardware modules are activated, the hardware modules perform some or all of the operations. In some embodiments, the hardware modules include one or more general-purpose circuits that are configured by executing instructions (program code, firmware, etc.) to perform the operations.

In some embodiments, a data structure representative of some or all of the structures and mechanisms described herein (e.g., computing device 100 and/or some portion thereof) is stored on a computer-readable storage medium that includes a database or other data structure which can be read by a computing device and used, directly or indirectly, to fabricate hardware comprising the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates/circuit elements from a synthesis library that represent the functionality of the hardware comprising the above-described structures and mechanisms. The netlist may then be placed and routed to produce a data set describing geometric shapes to be applied to masks. The masks may then be used in various semiconductor fabrication steps to produce a semiconductor circuit or circuits corresponding to the above-described structures and mechanisms. Alternatively, the database on the computer accessible storage medium may be the netlist (with or without the synthesis library) or the data set, as desired, or Graphic Data System (GDS) II data.

In this description, functional blocks may be referred to in describing some embodiments. Generally, functional blocks include one or more interrelated circuits that perform the described operations. In some embodiments, the circuits in a functional block include circuits that execute program code (e.g., microcode, firmware, applications, etc.) to perform the described operations.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. A memory, comprising:
a memory array comprising a plurality of cells arranged in rows and columns, each cell comprising devices for storing a bit of data;
a plurality of bit lines, each bit line coupled to the cells in a corresponding column of the memory array;
a plurality of logic circuits, a first input of each logic circuit coupled to a corresponding bit line and an output of each logic circuit coupled to the corresponding bit line, wherein each logic circuit is configured to perform one or more logical operations using data received on the first input and output a result from the one or more logical operations to the corresponding bit line via the output;
a row buffer comprising a plurality of memory elements, each memory element coupled between one of the plurality of logic circuits and a corresponding bit line, an input of each memory element coupled to the corresponding bit line, and an output of each memory element coupled to the first input of the one of the plurality of logic circuits;
a plurality of read outputs;
a plurality of read demultiplexers, each read demultiplexer coupled between one of the plurality of memory elements and the corresponding logic circuit, an input of each read demultiplexer coupled to the output of the one of the plurality of memory elements, a first output of each read demultiplexer coupled to a corresponding read output, and a second output of each read demultiplexer coupled to the first input of the corresponding logic circuit; and
a logical operation input coupled to a select input of each read demultiplexer, wherein, based on a logical state of the logical operation input, each read demultiplexer selectively outputs a value from the output of the one of the plurality of memory elements to either the corresponding read output or the first input of the corresponding logic circuit.

2. The memory of claim 1, further comprising:
a plurality of logic data inputs, each logic data input coupled to a second input of a corresponding logic circuit;
wherein each logic circuit is configured to perform the one or more logical operations using data received on both the first input and the second input.

3. The memory of claim 1, further comprising:
a control circuit configured to:
receive a command; and
based on the received command, cause the logic circuits to perform the one or more logical operations.

4. The memory of claim 1, wherein the one or more logical operations to be performed by each of the plurality of logic circuits comprise one or more of:
a logical AND;
a logical OR; and
a logical exclusive-OR (XOR).

5. The memory of claim 1, wherein the one or more logical operations to be performed by each of the plurality of logic circuits comprise complex logical operations.

6. The memory of claim 1, further comprising one or more operational circuits in the logic circuits, the operational circuits configured to perform an operation in addition to the one or more logical operations on the received data or the result from the logical operation.

7. The memory of claim 1, further comprising:
a plurality of write inputs; and
a plurality of write multiplexers, each write multiplexer coupled between a logic circuit and the corresponding bit line, a first input of each write multiplexer coupled to the output of the logic circuit, a second input of each write multiplexer coupled to a corresponding write input, and an output of each write multiplexer coupled to the corresponding bit line; and
a logical operation input coupled to a select input of each write multiplexer, wherein, based on a logical state of the logical operation input, each write multiplexer selectively outputs, to the corresponding bit line, a value from the write input or a value on the output of the logic circuit.

8. A method for performing a logical operation on data in a memory, comprising:
in a logic circuit coupled to a memory array in the memory, performing operations for:
receiving data from the memory array;
performing the logical operation on the received data; and
sending a result from the logical operation to the memory array to be stored in the memory array; and
in a control circuit, performing operations for:
generating a first logic operation control signal, the first logic operation control signal configured to:
cause data to be sent from the memory array to the logic circuit when a logical operation is to be performed; or
cause data to be sent from the memory array to a read data output when a read operation is to be performed.

9. The method of claim 8, further comprising:
in the logic circuit, performing operations for:
receiving logic inputs; and
using the data from the memory array and the logic inputs to perform the logical operation.

10. The method of claim 8,
wherein the control circuit further performs operations for:
receiving a command to perform the logical operation; and
based on the command, causing the logic circuit to perform the logical operation.

11. The method of claim 8, wherein performing the logical operation comprises performing a complex logical operation.

12. The method of claim 8, further comprising performing one or more other operations in addition to the logical operations on the received data or the result from the logical operation.

13. The method of claim 8, further comprising:
in the control circuit, performing operations for:
generating a second logic operation control signal, the second logic operation control signal configured to:
cause a result of the logical operation to be written back to the memory array when a logical operation has been performed; or
cause received write data to be written to the memory array when a write operation is to be performed.

14. A system, comprising:
a memory comprising a memory array, a control circuit, and a logic circuit; and
a processor coupled to the memory;
wherein the logic circuit is configured to:
receive data from the memory array;
perform a logical operation on the data from the memory array based on a command received from the processor; and
store results from the logical operation back to the memory array; and
wherein the control circuit is configured to:
generate a first logic operation control signal, the first logic operation control signal configured to:
cause data to be sent from the memory array to the logic circuit when a logical operation is to be performed; or
cause data to be sent from the memory array to a read data output when a read operation is to be performed.

15. The system of claim 14,
wherein the control circuit is further configured to:
receive, from the processor, a command to perform a logical operation on data from the memory array; and
cause the logic circuit to perform the logical operation on the data from the memory array.

16. The system of claim 14, wherein the logic circuit is further configured to:
receive, from the processor, one or more logic inputs, the logic inputs used to perform the logical operation.

17. The system of claim 14, further comprising performing one or more other operations in addition to the logical operations on the received data or the result from the logical operation.

* * * * *